United States Patent
Ow et al.

(10) Patent No.: US 11,670,513 B2
(45) Date of Patent: Jun. 6, 2023

(54) APPARATUS AND SYSTEMS FOR SUBSTRATE PROCESSING FOR LOWERING CONTACT RESISTANCE

(71) Applicant: APPLIED MATERIALS, INC., Santa Clara, CA (US)

(72) Inventors: Yueh Sheng Ow, Singapore (SG); Junqi Wei, Singapore (SG); Wen Long Favier Shoo, Singapore (SG); Ananthkrishna Jupudi, Singapore (SG); Takashi Shimizu, Chiba-Prefecture (JP); Kelvin Boh, Singapore (SG); Tuck Foong Koh, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/227,327

(22) Filed: Apr. 11, 2021

(65) Prior Publication Data

US 2021/0233773 A1  Jul. 29, 2021

Related U.S. Application Data

(62) Division of application No. 16/399,478, filed on Apr. 30, 2019, now Pat. No. 11,328,929.

(60) Provisional application No. 62/665,114, filed on May 1, 2018.

(51) Int. Cl.
| | | |
|---|---|---|
| *H01L 21/02* | (2006.01) | |
| *H01L 21/30* | (2006.01) | |
| *H01L 21/683* | (2006.01) | |
| *H01L 21/67* | (2006.01) | |

(52) U.S. Cl.
CPC .... *H01L 21/3003* (2013.01); *H01L 21/67017* (2013.01); *H01L 21/67103* (2013.01); *H01L 21/67109* (2013.01); *H01L 21/6831* (2013.01)

(58) Field of Classification Search
None
See application file for complete search history.

(56) References Cited

U.S. PATENT DOCUMENTS

| | | | |
|---|---|---|---|
| 5,886,865 A * | 3/1999 | Parkhe | H02N 13/00 361/233 |
| 6,215,641 B1 * | 4/2001 | Busse | H01L 21/6833 361/234 |
| 10,177,017 B1 * | 1/2019 | Yan | H01J 37/3211 |
| 2004/0177927 A1 | 9/2004 | Kikuchi et al. | |

(Continued)

OTHER PUBLICATIONS

PCT Search Report for PCT/US2019/030193, dated Aug. 14, 2019.

*Primary Examiner* — Ali Naraghi
(74) *Attorney, Agent, or Firm* — Moser Taboada

(57) ABSTRACT

Methods, apparatuses, and systems for substrate processing for lowering contact resistance in at least contact pads of a semiconductor device are provided herein. In some embodiments, a method of substrate processing for lowering contact resistance of contact pads includes: circulating a cooling fluid in at least one channel of a pedestal; and exposing a backside of the substrate located on the pedestal to a cooling gas to cool a substrate located on the pedestal to a temperature of less than 70 degrees Celsius. In some embodiments in accordance with the present principles, the method can further include distributing a hydrogen gas or hydrogen gas combination over the substrate.

18 Claims, 5 Drawing Sheets

(56) References Cited

U.S. PATENT DOCUMENTS

| | | | |
|---|---|---|---|
| 2004/0211365 A1 | 10/2004 | Yamaguchi | |
| 2010/0177454 A1* | 7/2010 | Elliot | H01L 21/67109 |
| | | | 361/234 |
| 2014/0370717 A1* | 12/2014 | Chakrapani | H01L 21/31138 |
| | | | 438/725 |
| 2015/0348813 A1 | 12/2015 | Mangalore et al. | |
| 2015/0364350 A1 | 12/2015 | White et al. | |
| 2016/0047598 A1 | 2/2016 | Yi et al. | |
| 2016/0189936 A1* | 6/2016 | Chia | C23C 16/45565 |
| | | | 156/345.33 |
| 2016/0265112 A1 | 9/2016 | Tolle et al. | |
| 2018/0076020 A1 | 3/2018 | Wu et al. | |
| 2018/0301622 A1* | 10/2018 | Kubo | H10B 61/00 |
| 2019/0035638 A1 | 1/2019 | Fan et al. | |
| 2019/0062947 A1* | 2/2019 | Savas | H01L 21/68707 |

* cited by examiner

APPARATUS AND SYSTEMS FOR SUBSTRATE PROCESSING FOR LOWERING CONTACT RESISTANCE

CROSS-REFERENCE TO RELATED APPLICATIONS

This application claims priority to U.S. patent application Ser. No. 16/399,478, filed Apr. 30, 2019, which claims priority to provisional patent application Ser. No. 62/665,114, filed May 1, 2018, each of which is incorporated herein by reference in its entirety.

FIELD

Embodiments of the present principles generally relate to substrate processing and more specifically to methods, apparatuses, and systems for substrate processing for lowering contact resistance.

BACKGROUND

Contact resistance, Rc, in semiconductor devices increases dramatically with reduction in scaling sizes. That is, smaller three-dimensional structures result in smaller contact areas, which result in rapid increases in contact resistance. For example, with scaling, Al and Cu pad openings are becoming smaller and smaller, making contact resistance, Rc, performance a challenge as high contact resistance results in loss of performance, errors in data and increased heat and power loss, to name a few negative effects.

SUMMARY

Methods, apparatuses, and systems for substrate processing for lowering contact resistance in at least contact pads of a semiconductor device are provided herein.

In some embodiments, a method of substrate processing for lowering contact resistance of contact pads includes: circulating a cooling fluid in at least one channel of a pedestal; and exposing a backside of the substrate located on the pedestal to a cooling gas to cool a substrate located on the pedestal to a temperature of less than 70 degrees Celsius.

In some embodiments in accordance with the present principles, the method can further include distributing a hydrogen gas or hydrogen gas combination over the substrate.

In some embodiments, an apparatus for processing a substrate includes: a process chamber having a processing space contained therein; a process shield disposed within the process chamber and forming an upper and outer boundary of the processing space; and a pedestal disposed in the process chamber opposite the process shield and forming a lower boundary of the processing space. In some embodiments, the pedestal comprises: an electrostatic chuck assembly to enable chucking of a substrate on the pedestal; at least one first channel for carrying a cooling liquid along the pedestal to cool the substrate on the pedestal; and at least one second channel for carrying a cooling gas along the pedestal and ending in a respective hole in a top portion of the pedestal for exposing the cooling gas to a backside of the substrate.

In some embodiments, an apparatus for processing a substrate includes: a process chamber having a processing space contained therein; a process kit disposed in the process chamber to prevent undesired deposition on one or more components of the process chamber; a process shield disposed within the process chamber and forming an upper and outer boundary of the processing space; a gas diffuser to distribute a hydrogen process gas into the processing space and over the substrate; and a pedestal. In some embodiments, the pedestal includes: an electrostatic chuck assembly comprising an insulator material to enable high voltage chucking of the substrate on the pedestal; at least one first channel for carrying a cooling liquid along the pedestal to cool the substrate on the pedestal; and at least one second channel for carrying a cooling gas along the pedestal and ending in a respective hole in a top portion of the pedestal for exposing the cooling gas to a backside of the substrate.

Other and further embodiments of the present principles are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate typical embodiments of the disclosure and are therefore not to be considered limiting of scope, for the disclosure may admit to other equally effective embodiments.

Figure 1:
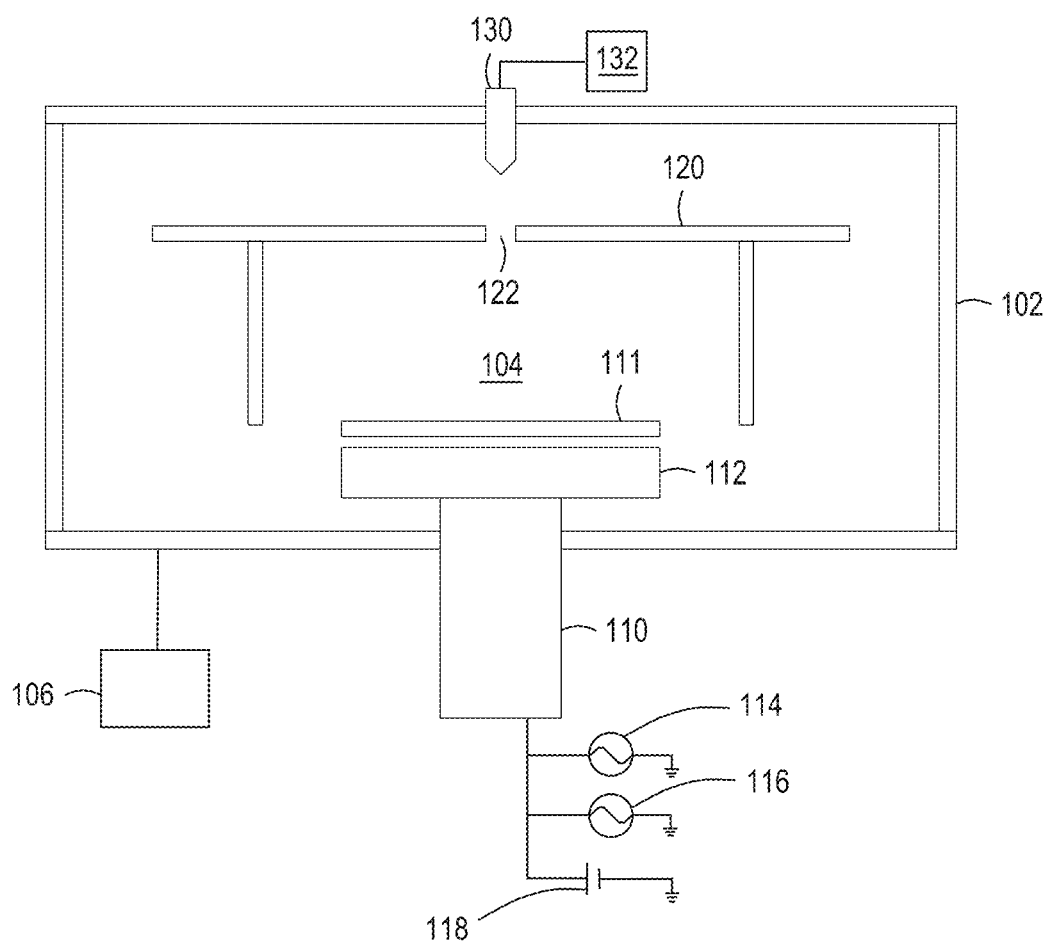
FIG. 1 depicts a high level block diagram of a process chamber in accordance with an embodiment of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods, apparatuses, and systems for substrate processing for lowering contact resistance in at least contact pads of a semiconductor are provided herein.

In various embodiments in accordance with the present principles, an electrostatic chuck (ESC) assembly (also referred to herein as a pedestal) includes a cooling system, for example at least one channel for circulating a cooling liquid and a cooling means, such as a subzero chiller, for quickly cooling a substrate. In addition, in some embodiments in accordance with the present principles the ESC assembly includes at least one channel for carrying a cooling gas and ending in at least one hole for delivering a cooling gas to the backside of a substrate to improve a cooling efficiency of the ESC. The inventors determined that maintaining a substrate at lower temperatures (e.g., below 70 degrees Celsius) during entire processing (e.g., an etching process) results in lower contact resistance (e.g., as low as single digit contact resistance measurements) of, for example, aluminum pad openings and copper pad openings in semiconductor devices.

Alternatively or in addition, in some embodiments in accordance with the present principles hydrogen gas or a hydrogen gas combination is added to a process, such as a pre-clean process. For example, in some embodiments, hydrogen gas or hydrogen gas combination is added to a process gas, such as argon, of a process chamber for facilitating a reactive removal of sputter polymers on surfaces (e.g., process kits) of a process chamber and contaminants on contact pads.

For example, in one embodiment, adding hydrogen and/or a hydrogen/helium gas combination to a process gas reduces the accumulation rate of polymer thickness build up on a portion of a process chamber, such as a process kit, which significantly increases the useful life of process kits, which are used to prevent undesired deposition on one or more components of the process chamber. In addition, the cleaner process chamber environment reduces a risk of re-contamination of a substrate during processing and thus results in lower contact resistance. Even further, the addition of the hydrogen gas or hydrogen gas combination to the process gas or to a substrate processing space of a process chamber after the processing of the process gas, in accordance with alternate embodiments of the present principles, can reduce contaminants on pad openings/contact pads, such as Al or Cu pad openings and/or contact pads.

In various embodiments, to further facilitate cooling efficiencies in a system in accordance with the present principles, an electrostatic chuck (ESC) assembly includes an insulator material which enables high voltage chucking without breakdown in the ESC. In addition, in some embodiments in accordance with the present principles a process gas inlet is located at the top/center of a shield of a process kit to enable a process gas to directly flow into a process cavity to control gas flow rate/direction into the process cavity. That is, since some polymer break down is more sensitive to an amount of a hydrogen or hydrogen combination gas, enabling a process gas to flow directly into a process cavity enables a much more accurate control of a gas flow rate/direction of the process gas into the process cavity.

FIG. 1 depicts a high level block diagram of a process chamber 100 in accordance with some embodiments of the present principles. The process chamber 100 of FIG. 1 comprises a housing 102 that surrounds a substrate processing region 104. The process chamber 100 of FIG. 1 further comprises a pedestal 110 having a substrate 111 thereon and a process shield 120. The process chamber 100 of FIG. 1 also illustratively comprises an optional gas diffuser 130. A pump 106 is coupled to the process chamber 100 to remove process byproducts and to facilitate maintaining a predetermined pressure within the process chamber 100.

The pedestal 110 of FIG. 1 comprises an electrostatic chuck 112, which in various embodiments comprises an optional insulator to enable high voltage chucking (described in greater detail below). In addition, the pedestal 110 includes one or more RF power supplies, such as two RF power supplies depicted in FIG. 1 (e.g., first RF power supply 114 and second RF power supply 116). The pedestal further includes a DC power supply 118 coupled to the electrostatic chuck 112 for controlling the operation thereof.

Figure 2:
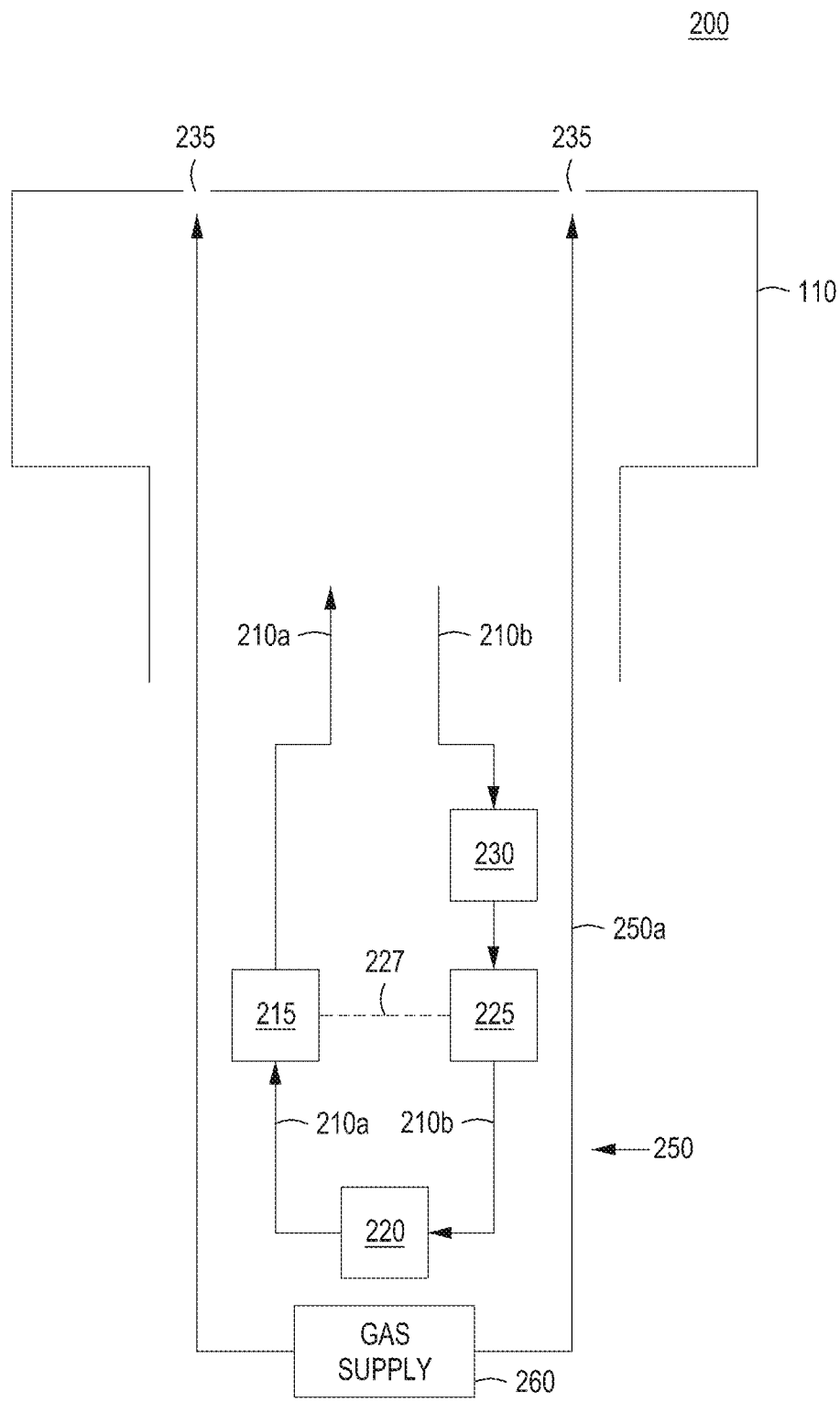
FIG. 2 depicts a schematic cross-sectional view of a portion of the process chamber of FIG. 1 including the pedestal in accordance with an embodiment of the present principles.

FIG. 2 depicts a schematic cross-sectional view of a portion of the process chamber 100 of FIG. 1 including the pedestal 110 and a cooling system 200 in accordance with an embodiment of the present principles. As depicted in FIG. 2, the pedestal 110 can include one or more delivery channels or delivery portions 210a, which can comprise delivery portions of at least one fluid channel 210 of the cooling system 200. Similarly and as depicted in FIG. 2, the pedestal 110 can include one or more delivery channels or delivery portions 250a, which can comprise delivery portions of at least one gas channel 250 of the cooling system 200. The delivery portions 210a, 250a can provide a temperature controlled fluid or a gas to the pedestal 110 for temperature control of a substrate on which operations are being performed in the process chamber 100. The channels 210 can also include one or more return portions 210b that provide a return path for at least the temperature controlled fluid from the pedestal 110.

FIG. 2 encompasses a variety of delivery and return configurations which can include a single or multiple channels that can distribute in different patterns within the pedestal 110, or can couple with multiple ports in the pedestal 110. The embodiment of FIG. 2 is not to be considered limited to the single configuration illustrated, but can utilize any configuration that incorporates the components discussed herein. For example, a first fluid channel, such as a delivery channel, can provide fluid communication between a cooling apparatus 220 (e.g., a chiller) and the pedestal 110, while a second fluid channel, such as a return fluid channel, can provide fluid communication between the pedestal 110 and the cooling apparatus 220. For example in one embodiment in accordance with the present principles, ethylene glycol can be cooled using the cooling apparatus 220, such as a chiller, and can be distributed within the pedestal 110 using the pedestal delivery channel or delivery channels 210a of the embodiment of FIG. 2, to cool a substrate located on the pedestal 110.

In some embodiments in accordance with the present principles, a set point for the cooling of the cooling liquid, such as the ethylene glycol, can be between −20 degrees Celsius and 0 degrees Celsius. In some embodiments, a flow rate for the cooling liquid can be set at between 30-35 liters/min. For example, in some embodiments, the set point for the cooling of the cooling liquid can be between −20 degrees Celsius and 0 degrees Celsius and the flow rate for the cooling liquid can be between 30-35 liters/min.

In accordance with various embodiments of the present principles, one or more of the delivery portions 250a (illustratively two of the delivery portions) of the at least one gas channel 250 of the embodiment of FIG. 2 can be used to distribute/communicate a cooling gas to a backside of a substrate located on the pedestal. For example, in the embodiment of FIG. 2, two of the delivery portions 250a of the pedestal 110 terminate in respective (illustratively two) holes 235 on the top of the pedestal 110. In various embodiments in accordance with the present principles, the delivery portions 250a terminating in the holes 235 on the top of the pedestal can be used to deliver one or more inert gases, for example one or more noble gases, such as helium gas or a helium gas combination, to a backside of a substrate mounted on the pedestal 110 for cooling the substrate. For example, in some embodiments, pure helium gas can be delivered from a gas supply 260 through the delivery portions 250a of the pedestal 110 and through the holes 235 in the top of the pedestal 110 to make contact with a backside of a substrate located on the pedestal 110 for cooling the substrate. In some embodiments, a helium gas combination, such as a 5% Hz/He gas combination (e.g., about 5% hydrogen gas with the remainder helium), can be delivered from a gas supply 260 through the delivery portions 250a of the pedestal 110 and through the holes 235 in the top of the pedestal 110 to make contact with a backside of a substrate located on the pedestal 110 for cooling the substrate.

In some embodiments, backside gas flow in accordance with the present principles can be between 8 standard cubic centimeters/minute (sccm) to 18 sccm and a minimal substrate backside pressure can be 4 Torr in order to achieve good cooling.

Again, FIG. 2 encompasses a variety of delivery and return configurations which can include a single or multiple channels that can distribute in different patterns within the pedestal 110, or can couple with multiple ports in the pedestal 110. The embodiment of FIG. 2 is not to be considered limited to the single configuration illustrated, but can utilize any configuration that incorporates the components discussed herein. In addition, although in the description of FIG. 2, a pure helium or helium gas combination is described, other pure gases or gas combinations, such as other inert or noble gases or gas combinations, can be used for cooling a substrate in accordance with the present principles.

The backside cooling of a substrate in accordance with the present principles, as described above, improves a cooling efficiency of a process chamber. More specifically, cooling a substrate as described above enables cooling a substrate from a typical 150 degrees Celsius (as is typical in process chambers during, for example, an etching process) to below 50 degrees Celsius in 10 seconds or less. Cooling a substrate as described above enables cooling of a substrate from temperatures as high as 300 degrees Celsius (or higher) to below 50 degrees.

The inventors have discovered that starting temperature for a substrate of 70 degrees Celsius or below advantageously helps minimize outgassing during a chamber processing of a substrate and specifically during an etching step. In addition, the ability to rapidly cool down a substrate, in accordance with the present principles and as described above, minimizes a recipe time, which improves a system throughput when processing substrates. The backside cooling of a substrate in accordance with the present principles and as described above, enables maintaining a substrate at less than 70 degrees Celsius during an entire etch process.

In some embodiments in accordance with the present principles, the electrostatic chuck 112 includes an insulator material to enable high voltage chucking. The high voltage chucking in accordance with the present principles enables higher and more efficient transfer of the cooling from the pedestal 110 to a substrate on the pedestal 110 because the substrate is held more tightly against the cooled pedestal 110 due to the high voltage chucking as compared to lower voltage chucking power. In some embodiments in accordance with the present principles, an optimized combination of RF frequencies (e.g., 13.56 MHz and 60 MHz using the first and second RF power supplies 114, 116) and powers allows for the best ratio of ions and radicals, and achieves an optimized wafer bias for high voltage chucking.

In accordance with various embodiments of the present principles, a heating apparatus can be incorporated with or coupled with a delivery fluid channel, and a temperature measurement device can be incorporated with or coupled with the return fluid channel to enable maintaining a substrate mounted on the pedestal 110 at a specific temperature. A flow controller can also be incorporated with or coupled with the at least one return fluid channel.

For example and as depicted in the embodiment of FIG. 2, a heater 215 can be coupled with the delivery portion 210a of the fluid channel. The heater 215 can be any number of applicable heaters that are capable of heating the temperature controlled fluid being delivered to the pedestal 110. In one embodiment, the heater 215 can have a precision of better than +/−1 degree Celsius, and can have a precision of better than +/−0.5 degrees Celsius, 0.3 degrees Celsius, 0.1 degrees Celsius, or better in various embodiments. The heater 215 can also have a fast response time from the time a signal is received to adjust the temperature. For example, the heater 215 can have a response time per 1 degree Celsius of less than or about 10 seconds from receipt of a communication instructing a change in temperature. The response time can also be less than or about 8 seconds, less than or about 5 seconds, less than or about 4 seconds, less than or about 3 seconds, less than or about 2 seconds, less than or about 1 seconds, less than or about 0.5 seconds, etc. or less.

The embodiment of FIG. 2 can also include a temperature measurement device 225 coupled with a return portion 210b of the at least one fluid channel 210. The temperature measurement device 225 can also be communicatively coupled (e.g., as indicated by dashed line 227) with the heater 215 to provide temperature readings and adjustment information for controlling the temperature of the fluid delivered to the substrate pedestal. In some embodiment, the temperature measurement device 225 can be a thermocouple or resistance temperature detector, as well as any other temperature sensing device. The temperature measurement device 225 can be coupled with the return portion 210b of the at least one fluid delivery channel, and can be coupled with the return portion to directly contact a fluid flowed through the at least one fluid channel, which can provide more accurate temperature reading. The temperature measurement device can have an accuracy of higher than 1 degree Celsius, such as about 0.1 degrees Celsius. The temperature reading can be delivered to the heater 215, which can include additional hardware or software (not shown) to compare the return temperature of a temperature controlled fluid to a set point to determine whether temperature adjustment utilizing heater 215 should occur.

The fluid utilized within the chamber portion depicted in FIG. 2 can be any known temperature controllable fluid, which can include water, steam, refrigerant, glycol, or any other fluid capable of temperature adjustment. For example, many process operations require temperatures below about 100 degrees Celsius, or below room temperature, if not down to sub-zero temperatures, and thus can include temperatures below or about 80 degrees Celsius, 50 degrees Celsius, 40 degrees Celsius, 30 degrees Celsius, 20 degrees Celsius, 10 degrees Celsius, 0 degrees Celsius, −10 degrees Celsius, etc. or less, including any range produced between any two of these temperatures. The foregoing temperature can be the temperature of the substrate or the pedestal during any operation. For cooling operations, a temperature controlled fluid having a freezing point below the requisite temperature can be used, such as a refrigerant or a combination of water and glycol, such as ethylene glycol, in any ratio from about 0:1 to about 1:0, including a 1:1 ratio, for example.

As described above, the chamber portion of FIG. 2 can further include a cooling apparatus 220 coupled with the delivery portion 210a and return portion 210b of the at least one fluid channel 210. The cooling apparatus 220 can be located between the heater and temperature measurement device within the loop, and can be on the same portion of the loop, or opposite portion of the loop as shown. The cooling apparatus 220 can comprise a chiller, heat exchanger, or any other device capable of reducing the temperature of the temperature controlled fluid being flowed through the system. The cooling apparatus 220 can be operated to singularly control the temperature of the temperature controlled fluid in embodiments, and can also work in conjunction or cooperation with the heater 215 to achieve a precise delivery temperature for the temperature controlled fluid.

The chamber portion depicted in FIG. 2 can further include a flow controller 230 coupled with a delivery or return portion of the at least one fluid channel 210, such as in the return portion as illustrated in the embodiment of FIG. 2. The flow controller 230 can include any number of valves, pumps, orifice plates, or other devices used to regulate flow. The flow controller 230 can also be utilized in conjunction with the heater 215 and the cooling apparatus 220 to regulate the temperature of the pedestal 110 and a substrate mounted thereon. For example, a flow can be increased or decreased to allow more or less temperature controlled fluid to be delivered to the pedestal 110 based on heat transfer that can be occurring based on processing conditions. Although the flow controller 230 may not have the accuracy or precision of the heater 215, for example, the flow controller 230 still can provide an additional variable for adjustment during process operations to control substrate and/or pedestal temperature.

In various embodiments in accordance with the present principles, hydrogen gas or a hydrogen gas combination is used in combination with a plasma sputter process to remove a polymer build-up from a surface of a process chamber and to remove contaminants from a contact pad. For example, in some substrate processing systems, a pre-clean step is implemented to remove native oxide of metal contact pads prior to a deposition or etching process being performed on a substrate. Specifically, an argon sputter process is used to remove a surface native oxide layer from an aluminum pad and to remove organic material contamination from the aluminum pad surface. The inventors discovered that adding hydrogen gas or a hydrogen gas combination to a substrate process advantageously further assists in the removal of organic material contamination from a contact pad surface and removal or reduction of a polymer build-up from a surface of the process chamber.

For example and referring back to the process chamber 100 of FIG. 1, in some embodiments in accordance with the present principles a gas source 132 delivers hydrogen gas or a hydrogen gas combination (e.g., a hydrogen gas/helium gas combination) to the process chamber 100. The gas source 132 can also provide, alternatively or in combination, an inert gas, such as a noble gas, for example, helium gas. In the embodiment of FIG. 1, the delivered hydrogen gas or hydrogen gas combination is received by the optional gas diffuser 130 and is distributed within the process chamber 100, for example through the process gas inlet 122 located at the top/center of the process shield 120. In the embodiment of FIG. 1, the gas diffuser 130 is centrally located in a top of the process chamber 100 to enable a uniform distribution or flow of the hydrogen gas or hydrogen gas combination across a surface of the substrate 111 disposed on the pedestal 110. The gas diffuser 130 can also control gas flow rate of a delivered hydrogen gas or hydrogen gas combination.

Figure 5:
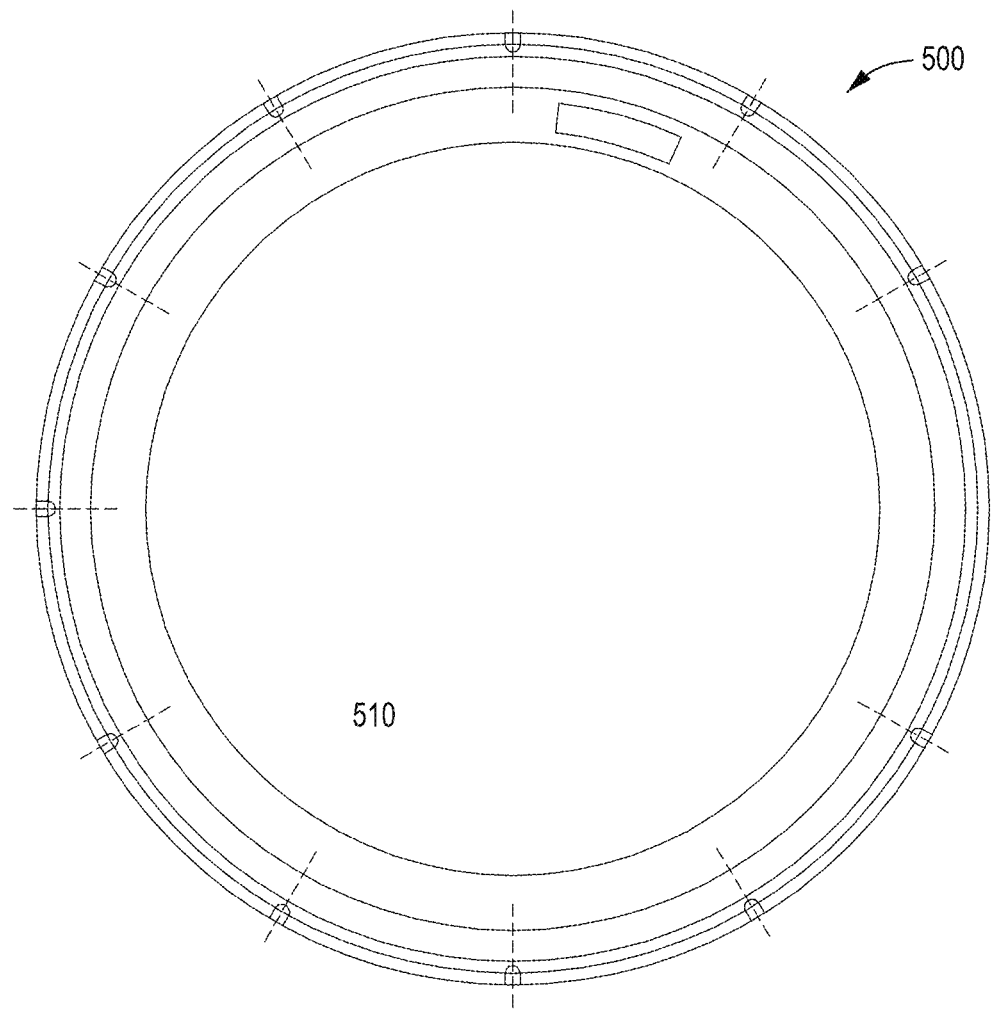
FIG. 5 depicts a top view of a process kit having a reduction in an accumulation rate of a polymer thickness build up in accordance with an embodiment of the present principles.

The inventors have discovered that adding hydrogen gas and/or a hydrogen gas combination to a process gas advantageously reduces the accumulation rate of polymer thickness build up on a portion of the process chamber 100 (e.g., a process kit of the process chamber, such as process shield 120 or other process kit components such as described below), which significantly increases the useful life of process kits and results in a lower cost of consumables. For example, FIG. 5 depicts a top view of a process kit 500, for example, that can be disposed atop and about the periphery of the pedestal 110. When hydrogen gas or a hydrogen gas combination is distributed over a surface of a substrate as described above, an accumulation rate of polymer thickness build up on a portion of the process kit 500 is reduced. In one illustrative embodiment, the inventors noted that when hydrogen gas is distributed over a surface of a substrate during an Ar sputter process, an accumulation rate of polymer thickness build up on a lower wall portion 510 of the process kit 500 was significantly reduced as compared to an Ar sputter process alone. Distributing hydrogen gas or a hydrogen gas combination over a surface of a substrate within the process chamber 100 in accordance with the present principles significantly increases the useful life of process kits and results in a lower cost of consumables.

In alternate embodiments in accordance with the present principles, an Ar sputter process is first performed and then a hydrogen gas or hydrogen gas combination is distributed over a surface of a substrate on the pedestal 110 to remove organic material contamination from a contact pad surface and to reduce the accumulation rate of polymer thickness build up on at least a portion of the process chamber 100. In various embodiments in accordance with the present principles, a hydrogen gas combination can include a hydrogen/helium gas combination, such as a 5% H₂/He gas combination as described above.

The inventors also propose adding hydrogen gas or a hydrogen gas combination into the process gas or distributing a hydrogen gas or a hydrogen gas combination over the substrate after the process gas until a bonding energy for a bulk polymer surface is higher than re-contaminated (Al—C) surface allowing selective removal of Al—C contaminant on Al pad to occur. The goal is to add an amount of hydrogen gas or a hydrogen gas combination to enable removal of a contaminant on a contact pad while minimizing break down of bulk polymer.

In some embodiments to determine the effects of the distribution of hydrogen gas or a hydrogen gas combination on at least one contact pad, a gas analyzer (not shown) can be implemented to detect, for example, an amount of polymer breakdown in a process. If the bulk polymer breakdown increases with a higher flow of hydrogen gas or a hydrogen gas combination, the flow of hydrogen gas or a hydrogen gas combination can be reduced to reduce an amount of bulk polymer breakdown and increase a breakdown of contaminants on a contact pad. Alternatively or in addition, a gas analyzer can be used to monitor an amount of organic material contamination being removed from the surface of a contact pad. If the organic material contamination being removed from the surface of a contact pad increases with a higher flow of hydrogen gas or a hydrogen gas combination, the flow of hydrogen gas or a hydrogen gas combination can be increased to further increase an amount of organic material contamination being removed from the surface of a contact pad.

Alternatively or in addition, in various embodiments in accordance with the present principles, to determine the effects of the distribution of hydrogen gas or a hydrogen gas combination on at least one contact pad, a contact resistance, Rc, of a contact pad can be measured. If the contact resistance, Rc, increases with a higher flow of hydrogen gas or a hydrogen gas combination, the flow of hydrogen gas or a hydrogen gas combination can be reduced. Alternatively, if the contact resistance, Rc, decreases with a higher flow of hydrogen gas or a hydrogen gas combination, the flow of hydrogen gas or a hydrogen gas combination can be increased. Thus, the flow of hydrogen gas or a hydrogen gas combination can be controlled, for example, until a maximum or desired benefit is detected.

In various embodiments in accordance with the present principles, to achieve an increased, and for example maximum, benefit from the addition of hydrogen gas or a hydrogen gas combination, the hydrogen gas or hydrogen gas combination is delivered to the process chamber 100 after a substrate on the pedestal 110 of the process chamber 100 has been cooled by any of the processes described above. More specifically, hydrogen gas or a hydrogen gas combination is delivered to the process chamber 100 after a substrate 111 on the pedestal 110 of the process chamber 100 has been cooled as described above to ensure the right reactive selectivity window requirement is met.

Advantages of the processes described herein include longer process kit life due to "self-cleaning" of process kits during process via $H_2$ reactive removal of sputter polymers on kits and lower contact resistance, Rc, of conductive structures (for example, contact pads), due to the above described cooling processes and contamination removal.

Referring back to FIG. 1, in some embodiments in accordance with the present principles the process shield 120 includes a process gas inlet 122 located at a top/center of the process shield 120, such that a gas or gas combination delivered to the process chamber 100 will flow directly into a process cavity of the process chamber 100. Because a break-down of some polymer is more sensitive to hydrogen gas or a hydrogen gas combination than others, the delivery of a process gas directly to a process cavity enables a much more accurate control of a removal or reduction of deposited polymers on surfaces of the process chamber or process kits associated with the process chamber in accordance with the present principles and as described above.

Figure 6:
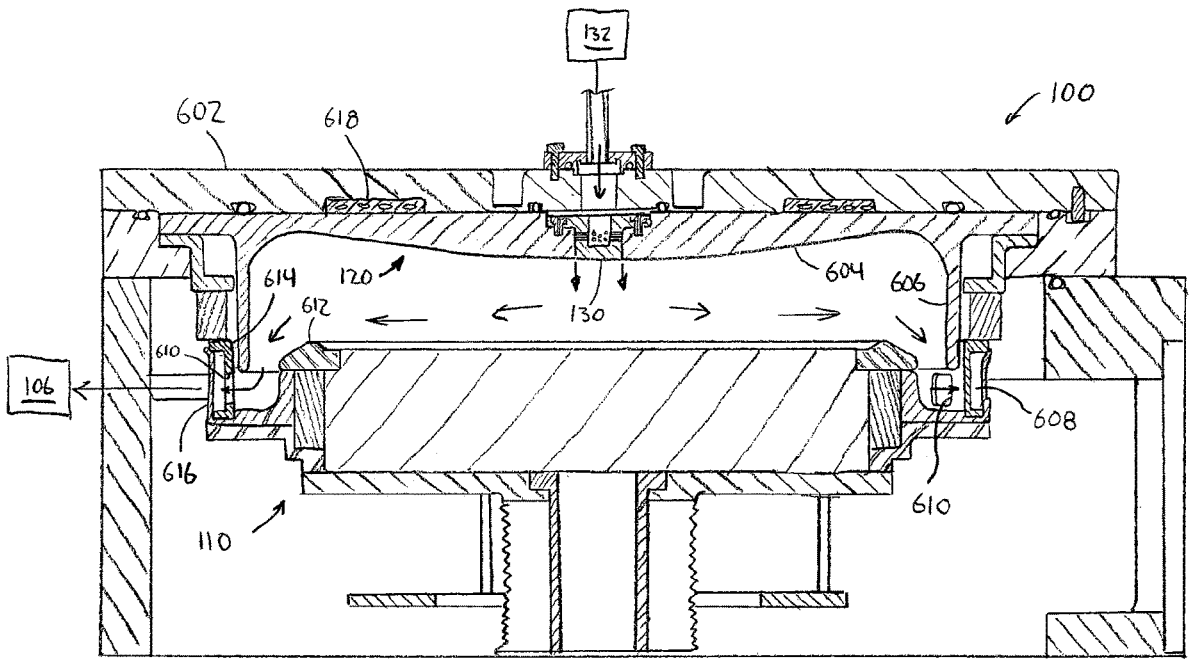
FIG. 6 depicts a cross-sectional side view of a process chamber in accordance with at least some embodiments of the present disclosure.

FIG. 6 depicts a cross-sectional side view of a process chamber in accordance with at least some embodiments of the present disclosure. More specifically, FIG. 6 depicts a process chamber and components thereof suitable for use as the process chamber 100 and the pedestal 110 described above with respect to FIGS. 1 and 2. As depicted in FIG. 6, the process chamber 100 includes the pedestal 110 and the process shield 120 disposed opposite the pedestal 110. In some embodiments, the process shield 120 can be coupled to or otherwise held against a lid 602 of the process chamber 100. Suitable gaskets, such as o-rings, can be provided between the lid 602 and the process shield 120 to prevent undesired gas flow or leakage between the lid 602 and the process shield 120. In some embodiments, one or more coolant channels 618 can be provided in the lid 602 proximate to the process shield 120 to facilitate thermal control of the process shield 120.

The process shield 120 and pedestal 110 together define a processing space therebetween. For example, the process shield 120 can define an upper and outer boundary of the processing space and a substrate support surface of the pedestal 110 can define a lower boundary of the processing space. The process shield 120 includes a curved inner surface 604 opposite the pedestal 110. In some embodiments, the curved inner surface 604 is a continuously curved surface from a central portion of the inner surface 604 to an outer portion of the inner surface 604. In some embodiments, the curved inner surface 604 continuously curves radially outward and upward from a central portion of the inner surface 604 to an outer portion of the inner surface 604 and then radially outward and downward to a portion of the inner surface 604 disposed radially outward of a substrate support surface of the pedestal 110 and then radially outward and downward to a vertical or substantially vertical downwardly extending wall 606 of the process shield 120. The downwardly extending wall 606 terminates at a location below the substrate support surface of the pedestal 110 to create a flow path that extends over the substrate support surface of the pedestal 110 and downward along the outer periphery of the pedestal 110.

Figure 7:
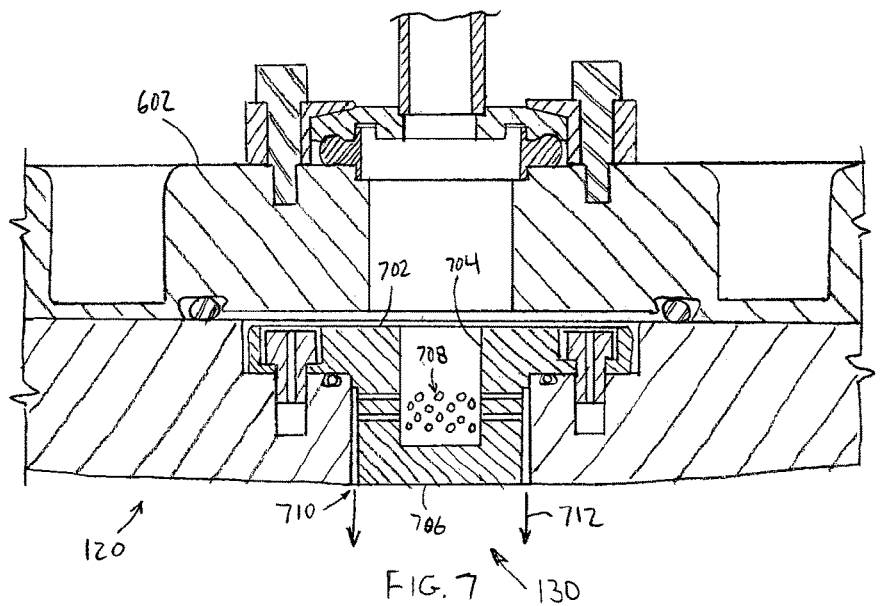
FIG. 7 depicts a cross-sectional view of the gas diffuser in accordance with at least some embodiments of the present disclosure.

Gas is provided to the processing space through the process shield 120, for example, through a central opening in the process shield 120. As depicted in FIG. 6, gas diffuser 130, coupled to the gas source 132, is disposed through the process shield 120 to provide a gas or gases as described herein to the processing space. FIG. 7 depicts a more detailed cross-sectional view of a gas diffuser suitable for use as the gas diffuser 130 in accordance with at least some embodiments of the present disclosure. As shown in FIG. 7, the gas diffuser 130 can be disposed within a central opening through the process shield 120. A central opening is disposed through the lid 602 and to fluidly couple the gas diffuser 130 to the gas source 132 (shown in FIG. 1 and FIG. 6). Suitable gaskets, such as o-rings or the like, can be provided to contain gas flow from the gas source 132 through the lid 602 and the gas diffuser 130 into the processing space of the process chamber 100.

In some embodiments, the gas diffuser 130 includes a cylindrical body 706 having a radially outward extending flange 702 at a first end of the cylindrical body 706. The radially outward extending flange 702 mates with a corresponding shelf formed in the process shield 120 and may include openings to facilitate coupling, such as by bolting, the gas diffuser 130 to the process shield 120. An opening 704 is formed through the first end and partially into the cylindrical body 706. The cylindrical body 706 has a diameter at a second end, opposite the first end and the flange 702, that is less than a diameter of an opening formed through the process shield 120 to form an annular gap 710 between the outer sidewall of the cylindrical body 706 and the sidewall of the opening in the process shield 120. A plurality of openings 708 are formed through the sidewall of the cylindrical body 706 between the opening 704 and the outer sidewall of the cylindrical body 706 to fluidly couple the gas source 132 and the processing space through the gas diffuser 130, as indicated by arrows 712. In some embodiments, the plurality of openings 708 include a plurality of radial openings, such as cylindrical holes, formed through the cylindrical body 706.

Returning to FIG. 6, the gas flow exiting the processing space is directed to plenum 608 disposed to the side of and radially outward of the pedestal 110. The plenum 608 can be an annular plenum, for example including an inner portion 614 comprising an annular wall, an upper radially outward extending flange, and a lower radially outward extending flange. An outer portion 616 extends between the upper radially outward extending flange, and a lower radially outward extending flange to enclose the plenum 608. A plurality of openings 610 are provided in the annular wall of the inner portion 614 to allow gas from the processing space to enter the plenum 608. Although FIG. 6 discloses one configuration of components to form the plenum 608, other configurations can also be used to exhaust the process gases from the processing space along the side of, and below, the substrate support surface of the pedestal 110. The plenum is coupled to the pump 106.

Figure 3:
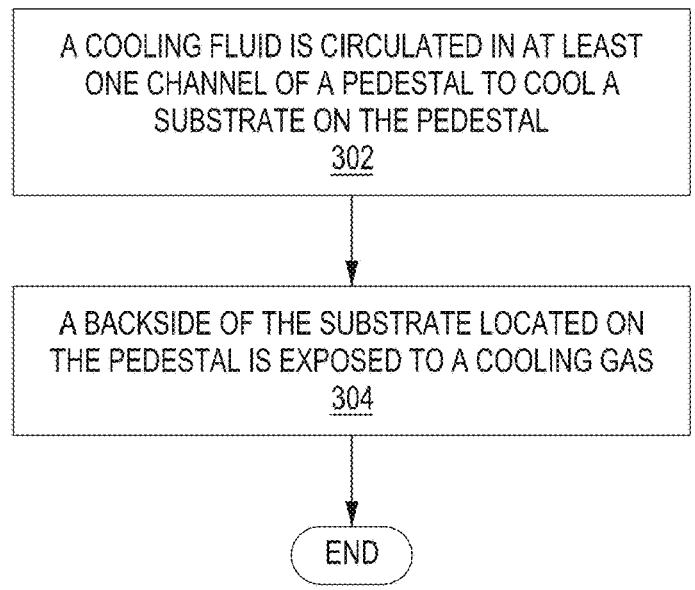
FIG. 3 depicts a flow diagram of a method for cooling a pedestal and/or a substrate during substrate processing resulting in a reduced contact resistance in contact pads in accordance with an embodiment of the present principles.

FIG. 3 depicts a flow diagram of a method 300 for cooling a pedestal and/or a substrate during substrate processing resulting in a reduced contact resistance in accordance with at least some embodiments of the present principles. The method 300 may be performed in the apparatus disclosed herein. The method 300 begins at 302 during which a cooling fluid is circulated in at least one channel of a pedestal to cool a substrate on the pedestal. As described above, in some embodiments in accordance with the present principles, a cooling fluid, such as ethylene glycol, can be cooled using a cooling apparatus 220. The cooling fluid is circulated in channels 210 of the pedestal 110 to cool the pedestal 110. The cooling fluid flow rate and temperature may be controlled as described above to cool the pedestal and/or substrate to a desired temperature. The cooled pedestal 110 is then able to cool a substrate located on the pedestal 110.

At 304, a backside of a substrate located on the pedestal 110 is exposed to a cooling gas. As described above, in some embodiments in accordance with the present principles, at least one channel in the pedestal 110 carries helium gas or a helium gas combination to at least one hole 235 in the pedestal 110 for exposing the backside of the substrate to the helium gas or the helium gas combination. The cooling gas, e.g., helium gas or a helium gas combination, can be controlled as described above to facilitate cooling the substrate to a desired temperature.

In some embodiments, the method 300 can be performed subsequent to a substrate process having a substrate temperature above room temperature. For example, in some embodiments, the method 300 can be performed subsequent to a degas process where the substrate is at a temperature of above 150 degrees Celsius. In some embodiments, the method 300 can be used to cool a substrate from a temperature at or above 150 degrees Celsius to a temperature of at or lower than 70 degrees Celsius, for example at or lower than 50 degrees Celsius. In some embodiments, the method 300 can cool the substrate to the aforementioned temperature in 10 seconds or less.

Figure 4:
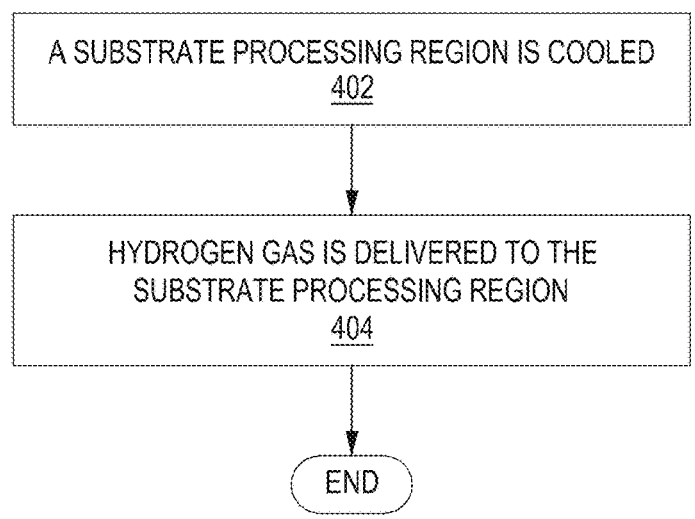
FIG. 4 depicts a flow diagram of a method for pre-cleaning a processing environment previous to substrate processing resulting in a reduced contact resistance in contact pads in accordance with an embodiment of the present principles.

FIG. 4 depicts a flow diagram of a method 400 for pre-cleaning a processing environment previous to substrate processing resulting in a reduced contact resistance in accordance with an embodiment of the present principles. The method 400 may be performed in the apparatus disclosed herein. The method 400 begins at 402 during which a substrate processing region is cooled. As described above, in some embodiments in accordance with the present principles, a pedestal and/or a substrate is cooled, for example, as described above with respect to the method 300. Such cooling of the pedestal/substrate results in a cooling of the substrate processing region.

At 404, hydrogen gas or hydrogen gas combination is distributed over a substrate in the substrate processing region. As described above, in one embodiment in accordance with the present principles, hydrogen gas or Hz/He combination is delivered to a substrate processing region along with an argon process gas. The addition of hydrogen gas or Hz/He combination to a process gas, either before, during, or after, for example a pre-clean process, reduces an accumulation rate of a polymer thickness build up on a portion of a process chamber, such as a process kit, which significantly increases the useful life of process kits and reduces a risk of re-contamination of a substrate during processing. The addition of hydrogen gas to a process gas, either before, during, or after, for example a pre-clean process, also reduces a contamination on a surface of a contact pad as described above.

In some embodiments, a sputter etch process can be performed to clean exposed surfaces of a conductive feature (e.g., a contact pad) on the substrate, for example using an argon sputter etch process as described above. For example, before, during, or after 404 is performed, a sputter etch process can be performed, such as an argon sputter etch process, to clean the exposed surfaces of the conductive feature (e.g., the contact pad). Such cleaning can include removal of oxides, such as AlOx from aluminum contact pads (or other oxides from contact pads of other materials such as, for example, copper). The removal of the native oxide can be performed before, during, or after 404, in which organic contamination (such as Al—C) is removed from the conductive feature.

In one specific exemplary embodiment, a substrate 111 having exposed contact pads surrounded by polymer dielectric material can be first subjected to a degas process. The degas process can have an elevated temperature of, for example, 150 degrees Celsius or more. The substrate 111 can subsequently be cooled as described with respect to the method 300 above to reduce the substrate temperature from at or near the degas temperature to less than 70 degrees Celsius, or less than 50 degrees Celsius within about 10 seconds or less. Next, a hydrogen gas or Hz/He combination is provided to the process chamber 100 and distributed over the substrate 111 in the substrate processing region as described above with respect to the method 400. A sputter etch pre-clean process, such as an argon sputter etch process, can be performed as described above to remove contaminants, such as a native oxide, from the exposed contact pads. In some embodiments, the hydrogen gas or Hz/He combination can be provided prior to performing the sputter etch pre-clean process. In some embodiments, the hydrogen gas or Hz/He combination can be provided while performing the sputter etch pre-clean process. In some embodiments, the hydrogen gas or Hz/He combination can be provided subsequent to performing the sputter etch pre-clean process.

While the foregoing is directed to embodiments of the present disclosure, other and further embodiments of the disclosure may be devised without departing from the basic scope thereof.

The invention claimed is:

1. An apparatus for processing a substrate, comprising;
   a process chamber having a processing space contained therein;
   a process shield disposed within the process chamber and forming an upper and outer boundary of the processing space, wherein the process shield comprises a process gas inlet, shaped and located on the process shield for receiving a hydrogen gas from an external gas source and directing the received hydrogen gas over a top of the substrate to clean the substrate; and
   a pedestal disposed in the process chamber opposite the process shield and forming a lower boundary of the processing space, wherein the pedestal comprises:
      an electrostatic chuck assembly to enable chucking of a substrate on the pedestal;
      at least one first channel for carrying a cooling liquid along the pedestal to cool the substrate on the pedestal; and at least one second channel for carrying a cooling gas along the pedestal and ending in a respective hole in a top portion of the pedestal for exposing the cooling gas to a backside of the substrate.

2. The apparatus of claim 1, wherein the process shield includes a curved inner surface opposite a support surface of the pedestal.

3. The apparatus of claim 2, wherein the curved inner surface curves radially outward and upward from a central portion of the inner surface to an outer portion of the inner surface and then radially outward and downward a portion of the inner surface disposed radially outward of a substrate support surface of the pedestal and then radially outward and downward to a substantially vertical downwardly extending wall of the process shield.

4. The apparatus of claim 2, wherein the process shield further includes a substantially vertical downwardly extending wall that terminates at a location radially outward of and lower than a substrate support surface of the pedestal.

5. The apparatus of claim 1, further comprising a cooling device configured to cool the cooling liquid to a temperature of less than 70 degrees Celsius.

6. The apparatus of claim 1, further comprising a gas diffuser coupled to the processing space to flow a gas over the substrate.

7. The apparatus of claim 6, wherein the gas diffuser is disposed in an opening of a housing of the process chamber and over the process gas inlet of the process shield.

8. The apparatus of claim 7, wherein the gas diffuser has a cylindrical body having a diameter smaller than a diameter of the opening in the housing to define an annular gap between the cylindrical body and the process shield, and wherein the cylindrical body further includes a plurality of radial openings through a sidewall of the cylindrical body to fluidly couple the annular gap to an opening formed in the cylindrical body.

9. The apparatus of claim 6, further comprising a gas source coupled to the gas diffuser, wherein the gas source provides hydrogen gas or a hydrogen/helium gas combination alone or in combination with an inert gas.

10. The apparatus of claim 1, wherein the cooling gas comprises at least one of a helium gas or a hydrogen/helium gas combination.

11. Apparatus for processing a substrate, comprising:
a process chamber having a processing space contained therein;
a process kit disposed in the process chamber to prevent undesired deposition on one or more components of the process chamber;
a process shield disposed within the process chamber and forming an upper and outer boundary of the processing space, wherein the process shield comprises a process gas inlet, shaped and located on the process shield for receiving a hydrogen gas from a gas diffuser and directing the received hydrogen gas over a top of the substrate to clean the substrate;
a gas diffuser, located in an opening of a housing of the process chamber, receiving a hydrogen gas from a gas source and directing the hydrogen gas towards the process shield; and
a pedestal, comprising:
an electrostatic chuck assembly comprising an insulator material to enable high voltage chucking of the substrate on the pedestal;
at least one first channel for carrying a cooling liquid along the pedestal to cool the substrate on the pedestal; and
at least one second channel for carrying a cooling gas along the pedestal and ending in a respective hole in a top portion of the pedestal for exposing the cooling gas to a backside of the substrate.

12. The apparatus of claim 11, wherein the process shield includes a curved inner surface opposite a support surface of the pedestal, wherein the curved inner surface curves radially outward and upward from a central portion of the inner surface to an outer portion of the inner surface and then radially outward and downward a portion of the inner surface disposed radially outward of a substrate support surface of the pedestal and then radially outward and downward to a substantially vertical downwardly extending wall of the process shield.

13. The apparatus of claim 12, wherein the process shield further includes a substantially vertical downwardly extending wall that terminates at a location radially outward of and lower than a substrate support surface of the pedestal.

14. The apparatus of claim 11, further comprising a cooling device configured to cool the cooling liquid to a temperature of less than 70 degrees Celsius.

15. The apparatus of claim 11, wherein the gas diffuser is disposed in the opening of the housing of the process chamber over the process gas inlet of the process shield.

16. The apparatus of claim 15, wherein the gas diffuser has a cylindrical body having a diameter smaller than a diameter of the opening in the housing to define an annular gap between the cylindrical body and the process shield, and wherein the cylindrical body further includes a plurality of radial openings through a sidewall of the cylindrical body to fluidly couple the annular gap to an opening formed in the cylindrical body.

17. The apparatus of claim 11, further comprising a gas source coupled to the gas diffuser, wherein the gas source provides hydrogen gas or a hydrogen/helium gas combination alone or in combination with an inert gas.

18. The apparatus of claim 11, wherein the cooling gas comprises at least one of a helium gas or a hydrogen/helium gas combination.

* * * * *